(12) United States Patent
Oh

(10) Patent No.: US 11,849,576 B2
(45) Date of Patent: Dec. 19, 2023

(54) NON-VOLATILE MEMORY DEVICE AND MANUFACTURING METHOD THEREOF

(71) Applicant: YANGTZE MEMORY TECHNOLOGIES CO., LTD., Wuhan (CN)

(72) Inventor: Jin Yong Oh, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/094,960

(22) Filed: Jan. 9, 2023

(65) Prior Publication Data

US 2023/0164984 A1    May 25, 2023

Related U.S. Application Data

(63) Continuation of application No. 17/324,004, filed on May 18, 2021, now Pat. No. 11,581,323, and a (Continued)

(51) Int. Cl.
| | |
|---|---|
| H01L 23/528 | (2006.01) |
| H10B 41/20 | (2023.01) |
| G11C 5/06 | (2006.01) |
| H01L 23/552 | (2006.01) |
| H10B 43/20 | (2023.01) |

(52) U.S. Cl.
CPC ............. *H10B 41/20* (2023.02); *G11C 5/06* (2013.01); *H01L 23/528* (2013.01); *H01L 23/552* (2013.01); *H10B 43/20* (2023.02)

(58) Field of Classification Search
CPC .......................... H01L 23/528; H01L 23/552
See application file for complete search history.

(56) References Cited

U.S. PATENT DOCUMENTS

| | | | |
|---|---|---|---|
| 10,074,667 B1 | 9/2018 | Higashi | |
| 2016/0141249 A1* | 5/2016 | Kang | H01L 23/552 257/751 |

(Continued)

FOREIGN PATENT DOCUMENTS

| | | |
|---|---|---|
| CN | 107658315 A | 2/2018 |
| CN | 108377660 A | 8/2018 |

(Continued)

*Primary Examiner* — Errol V Fernandes
(74) *Attorney, Agent, or Firm* — BAYES PLLC

(57) ABSTRACT

A memory device includes a first semiconductor structure and a second semiconductor structure. The memory device further includes a bonding structure between the first semiconductor structure and the second semiconductor structure, the bonding structure comprising a first bonding pattern and a second bonding pattern in contact with each other, the first semiconductor structure being electrically connected with the second semiconductor structure through the bonding structure. The memory device further includes a shielding structure between the first semiconductor structure and the second semiconductor structure and surrounding the bonding structure, the shielding structure comprising a third bonding pattern and a fourth bonding pattern in contact with each other, the shielding structure being electrically connected with a biased voltage.

20 Claims, 8 Drawing Sheets

Related U.S. Application Data continuation of application No. 16/672,527, filed on Nov. 4, 2019, now Pat. No. 11,063,056, said application No. 17/324,004 is a continuation of application No. 16/672,527, filed on Nov. 4, 2019, now Pat. No. 11,063,056, which is a continuation of application No. PCT/CN2019/102297, filed on Aug. 23, 2019.

(56) References Cited

U.S. PATENT DOCUMENTS

| | | |
|---|---|---|
| 2016/0163635 A1 | 6/2016 | Yun |
| 2016/0225452 A1 | 8/2016 | Lee et al. |
| 2017/0062453 A1 | 3/2017 | Son |
| 2017/0263642 A1 | 9/2017 | Nishikawa |
| 2018/0358373 A1 | 12/2018 | Fukuzumi |
| 2019/0081017 A1 | 3/2019 | Nakajima |
| 2020/0286905 A1 | 9/2020 | Ka et al. |

FOREIGN PATENT DOCUMENTS

| | | |
|---|---|---|
| CN | 109075170 A | 12/2018 |
| CN | 109155320 A | 1/2019 |
| CN | 109219885 A | 1/2019 |
| CN | 109564923 A | 4/2019 |
| TW | 200703576 | 1/2007 |

\* cited by examiner

NON-VOLATILE MEMORY DEVICE AND MANUFACTURING METHOD THEREOF

CROSS REFERENCE TO RELATED APPLICATIONS

This application is a continuation of U.S. application Ser. No. 17/324,004, filed on May 18, 2021, which is a continuation of U.S. application Ser. No. 16/672,527, filed on Nov. 4, 2019 and issued as U.S. Pat. No. 11,063,056, which is a continuation of International Application No. PCT/CN2019/102297, filed on Aug. 23, 2019, both of which are incorporated herein by reference in their entireties.

BACKGROUND

The present disclosure relates to a memory device and a manufacturing method thereof, and more particularly, to a non-volatile memory device and a manufacturing method thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. As the dimension of the memory device becomes smaller, the electrical interference between the memory array and the peripheral devices becomes serious influence the operation of the memory device.

SUMMARY

A non-volatile memory device and a manufacturing method thereof are provided in the present disclosure. A memory array disposed on a first substrate is electrically connected with a circuit structure disposed on a second substrate through a bonding structure. A shielding structure is disposed between the memory array and the circuit structure and surrounds the bonding structure. The shielding structure is electrically connected to a voltage source for reducing coupling effects between the bonding structure and the circuit structure and/or coupling effects between the circuit structure and the memory array. The operation and/or the electrical performance of the non-volatile memory device may be improved accordingly.

According to an embodiment of the present disclosure, a non-volatile memory device is provided. The non-volatile memory device includes a first substrate, a second substrate, a memory array, a circuit structure, a bonding structure, and a shielding structure. A second front side of the second substrate faces a first front side of the first substrate. The memory array is disposed on the first substrate and disposed at the first front side of the first substrate. The circuit structure is disposed on the second substrate and disposed at the second front side of the second substrate. The bonding structure is disposed between the memory array and the circuit structure. The circuit structure is electrically connected with the memory array through the bonding structure. The shielding structure is disposed between the memory array and the circuit structure and surrounds the bonding structure. The shielding structure is electrically connected to a voltage source.

In some embodiment, the shielding structure is electrically isolated from the bonding structure.

In some embodiment, the voltage source comprises a ground voltage source or a supply voltage source.

In some embodiment, the non-volatile memory device further includes a first interconnection structure and a second interconnection structure. The first interconnection structure is disposed between the memory array and the bonding structure. The bonding structure is electrically connected with the memory array through the first interconnection structure. The second interconnection structure is disposed between the circuit structure and the bonding structure. The bonding structure is electrically connected with the circuit structure through the second interconnection structure.

In some embodiment, the non-volatile memory device further includes a first interlayer dielectric and a second interlayer dielectric. The first interlayer dielectric covers the memory array, and the first interconnection structure is disposed in the first interlayer dielectric. The second interlayer dielectric covers the circuit structure, and the second interconnection structure is disposed in the second interlayer dielectric. The bonding structure includes a first bonding pattern and a second bonding pattern. The first bonding pattern is electrically connected with the first interconnection structure. The second bonding pattern is electrically connected with the second interconnection structure. The first bonding pattern contacts and is electrically connected with the second bonding pattern.

In some embodiment, the shielding structure includes a third bonding pattern and a fourth bonding pattern. The third bonding pattern contacts and electrically connected with the fourth bonding pattern.

In some embodiment, the first bonding pattern and the third bonding pattern are at least partially disposed in the first interlayer dielectric, and the second bonding pattern and the fourth bonding pattern are at least partially disposed in the second interlayer dielectric.

In some embodiment, an interface between the first bonding pattern and the second bonding pattern is coplanar with an interface between the third bonding pattern and the fourth bonding pattern.

In some embodiment, the first interconnection structure comprises a source line mesh, and the bonding structure is electrically connected with the source line mesh.

In some embodiment, the non-volatile memory device further includes a connection structure disposed between the memory array and the circuit structure. The connection structure is electrically connected with the circuit structure, and the shielding structure further surrounds the connection structure.

In some embodiment, the non-volatile memory device further includes a contact pad and a contact structure. The contact pad is disposed at the first back side of the first substrate. The contact structure penetrates the memory array and is electrically connected with the contact pad. The circuit structure is electrically connected with the contact pad through the connection structure and the contact structure.

In some embodiment, the memory array includes a memory stack and memory strings. Each of the memory strings penetrates the memory stack.

According to an embodiment of the present disclosure, a manufacturing method of a non-volatile memory device is provided. The manufacturing method includes the following steps. A memory array is formed on a first substrate, and the memory array is formed at a first front side of the first substrate. A circuit structure is formed on a second substrate, and the circuit structure is formed at a second front side of the second substrate. A bonding process is performed for bonding the first substrate with the memory array formed thereon and the second substrate with the circuit structure formed thereon. The second front side of the second substrate faces the first front side of the first substrate after the bonding process. A bonding structure is located between the memory array and the circuit structure, the circuit structure is electrically connected with the memory array through the bonding structure, and a shielding structure is located between the memory array and the circuit structure and surrounds the bonding structure. The shielding structure is electrically connected to a voltage source.

In some embodiment, a forming method of the bonding structure includes the following steps. A first portion of the bonding structure is formed on the first substrate before the bonding process, and the first portion of the bonding structure is electrically connected to the memory array. A second portion of the bonding structure is formed on the second substrate before the bonding process, and the second portion of the bonding structure is electrically connected to the circuit structure. The first portion of the bonding structure contacts and is electrically connected with the second portion of the bonding structure after the bonding process.

In some embodiment, a forming method of the shielding structure includes the following steps. A first portion of the shielding structure is formed on the first substrate before the bonding process. A second portion of the shielding structure is formed on the second substrate before the bonding process. The first portion of the shielding structure contacts and is electrically connected with the second portion of the shielding structure after the bonding process.

In some embodiment, the shielding structure is electrically isolated from the bonding structure.

In some embodiment, the voltage source comprises a ground voltage source or a supply voltage source.

In some embodiment, the manufacturing method of the non-volatile memory device further includes the following steps. A first interconnection structure is formed on the memory array before the bonding process, and the bonding structure is electrically connected with the memory array through the first interconnection structure. A second interconnection structure is formed on the circuit structure before the bonding process, and the bonding structure is electrically connected with the circuit structure through the second interconnection structure.

In some embodiment, the first interconnection structure comprises a source line mesh, and the bonding structure is electrically connected with the source line mesh.

In some embodiment, the manufacturing method of the non-volatile memory device further includes the following steps. A connection structure is formed between the memory array and the circuit structure. The connection structure is electrically connected with the circuit structure, and the shielding structure further surrounds the connection structure. A contact structure is formed penetrating the memory array. A contact pad is formed at a back side of the first substrate. The circuit structure is electrically connected with the contact pad through the connection structure and the contact structure.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
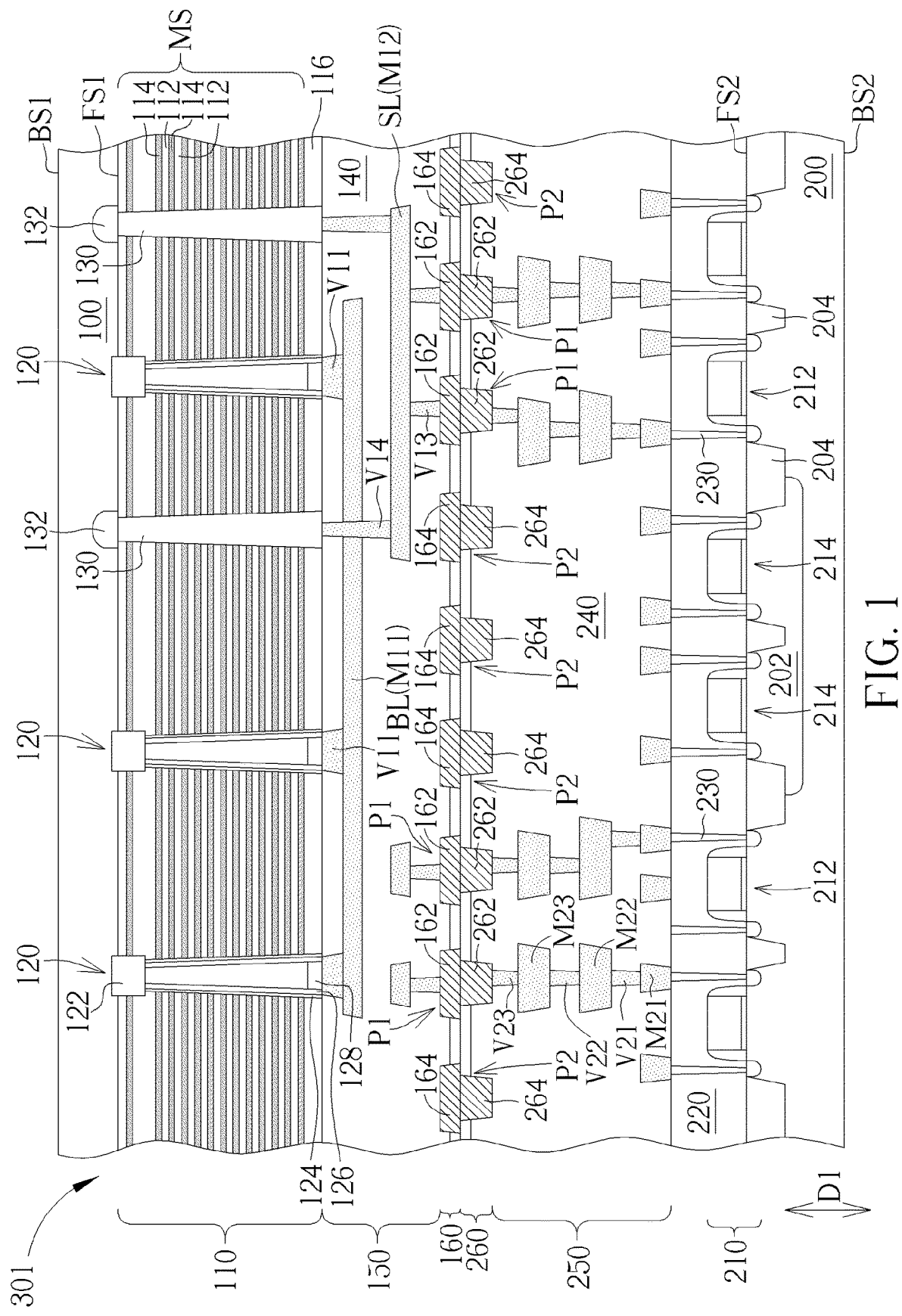
FIG. 1 is a schematic drawing illustrating a non-volatile memory device according to a first embodiment of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to an object. Such terms are intended to describe any possible layer forming techniques including, but not limited to, thermal growth, sputtering, evaporation, chemical vapor deposition, epitaxial growth, electroplating, and the like.

Figure 2:
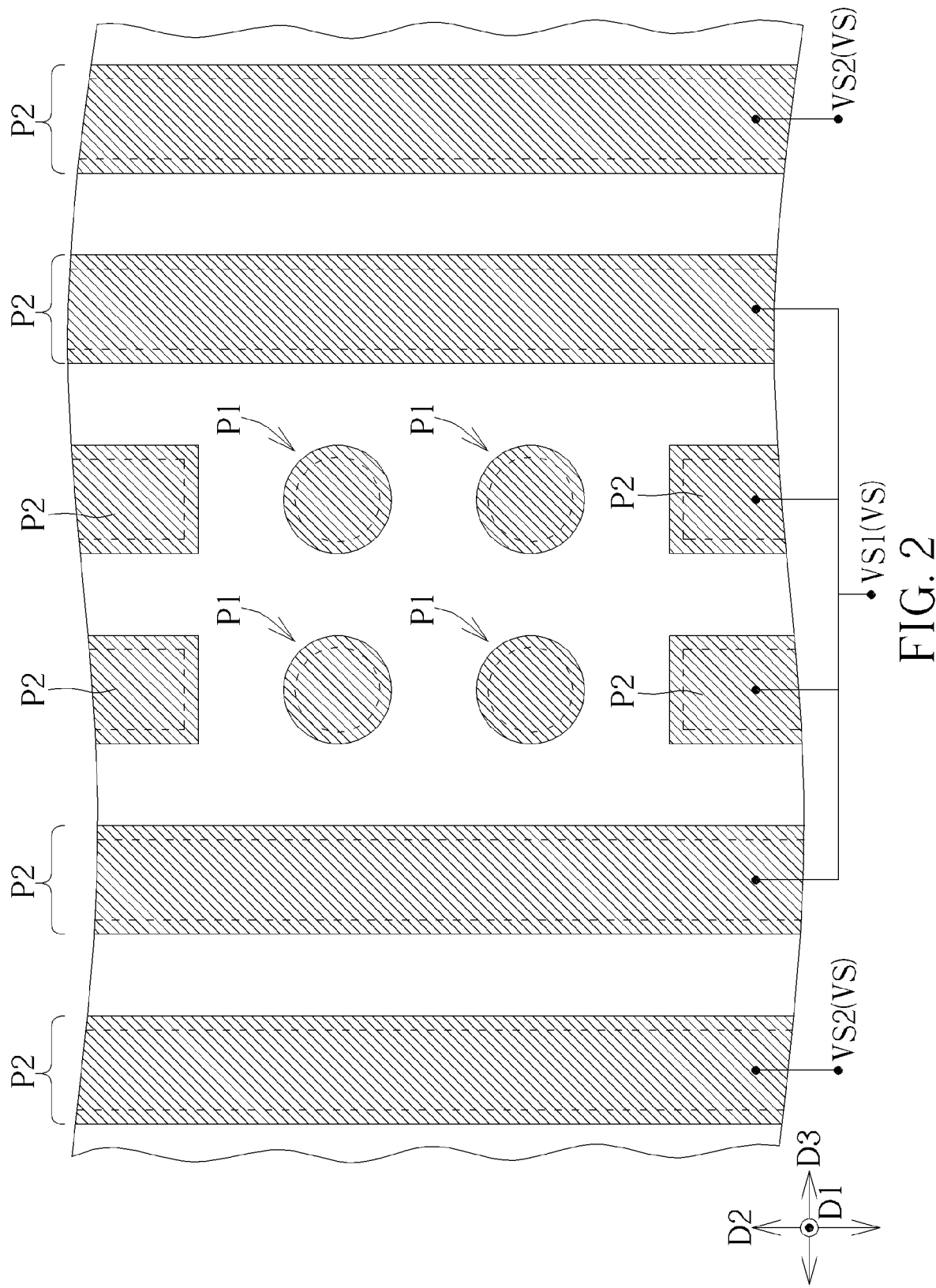
FIG. 2 is a schematic drawing illustrating a bonding structure and a shielding structure in the non-volatile memory device according to the first embodiment of the present disclosure.

Please refer to FIG. 1 and FIG. 2. FIG. 1 is a schematic drawing illustrating a non-volatile memory device according to a first embodiment of the present disclosure, and FIG. 2 is a schematic drawing illustrating a bonding structure and a shielding structure in the non-volatile memory of this embodiment. As shown in FIG. 1 and FIG. 2, a non-volatile memory device 301 is provided in this embodiment. The non-volatile memory device 301 includes a first substrate 100, a second substrate 200, a memory array 110, a circuit structure 210, a bonding structure P1, and a shielding structure P2. The first substrate 100 may have a first front side FS1 and a first back side BS1, and the second substrate 200 may have a second front side FS2 and a second back side BS2. The first front side FS1 and the first back side BS1 may be two opposite sides of the first substrate 100 in a vertical direction (such as a first direction D1 shown in FIG. 1), and the second front side FS2 and the second back side BS2 may be two opposite sides of the second substrate 200 in the vertical direction. In some embodiments, the first direction D1 may be regarded as a thickness direction of the first substrate 100 and a thickness direction of the second substrate 200, but not limited thereto. In the non-volatile memory device 301, the second front side FS2 of the second substrate 200 faces the first front side FS1 of the first substrate 100. The memory array 110 is disposed on the first substrate 100 and disposed at the first front side FS1 of the first substrate 100. The circuit structure 210 is disposed on the second substrate 200 and disposed at the second front side FS2 of the second substrate 200. Therefore, the memory array 110 and the circuit structure 210 may be disposed between the first substrate 100 and the second substrate 200. The bonding structure P1 is disposed between the memory array 110 and the circuit structure 210. The circuit structure 210 is electrically connected with the memory array 110 through the bonding structure P1. The shielding structure P2 is disposed between the memory array 110 and the circuit structure 210, and the shielding structure P2 surrounds the bonding structure P1. The shielding structure P2 is electrically connected to a voltage source VS. In other words, the shielding structure P2 is not electrically floating, and the shielding structure P2 may be biased by the voltage source VS for reducing coupling effects between the bonding structure P1 and the circuit structure 210 and/or coupling effects between the circuit structure 210 and the memory array 110. The operation and/or the electrical performance of the non-volatile memory device 301 may be improved accordingly.

In the non-volatile memory device 301, the shielding structure P2 is physically separated from the bonding structure P1, and the shielding structure P2 may be electrically isolated from the bonding structure P1 for providing a shielding effect. In some embodiments, the voltage source VS may include a ground voltage source (such as Vss), a supply voltage source (such as Vcc), or other suitable types of voltage sources. Therefore, the shielding structure P2 may be biased to ground or biased by external power sources or internal power sources. In some embodiments, the shielding structure P2 may include a plurality of segments surrounding the bonding structure P1 in a horizontal direction (such as a second direction D2 or a third direction D3 shown in FIG. 3). The horizontal direction may be parallel to a surface of the first substrate 100 and/or a surface of the second substrate 200, but not limited thereto. In some embodiments, the segments of the shielding structure P2 may be electrically connected with different voltage sources VS respectively. For instance, some of the segments may be electrically connected to a first voltage source VS1, and some of the segments may be electrically connected to a second voltage source VS2 different from the first voltage source VS1. The first voltage source VS1 may be a ground voltage source, and the second voltage source VS2 may be a supply voltage source, but not limited thereto. In some embodiments, all of the segments of the shielding structure P2 may also be electrically connected to the same voltage source VS. Additionally, when the shielding structure P2 is biased with ground and/or power sources, the shielding structure P2 may also act like pool caps for enhancing power source stability in the non-volatile memory device.

In some embodiments, the first substrate 100 and the second substrate 200 may respectively include silicon (e.g., monocrystalline silicon, polycrystalline silicon), silicon germanium (SiGe), silicon carbide (SiC), gallium nitride (GaN), indium phosphide (InP), gallium arsenide (GaAs), germanium (Ge), silicon on insulator (SOI), germanium on insulator (GOI), or any suitable combination thereof. In some embodiments, the memory array 110 may include a memory stack MS, a plurality of memory strings 120, and a plurality of slit structures 130. The memory stack MS may include an alternating conductive/dielectric stack composed of dielectric layers 112 and conductive layers 114 alternately stacked in the first direction D1, but not limited thereto. The dielectric layer 112 may include silicon oxide or other suitable dielectric materials, and the conductive layer 114 may include conductive materials including, but not limited to, tungsten, cobalt, copper, aluminum, doped silicon, polysilicon, silicide, or any combination thereof. Each of the memory strings 120 and each of the slit structures 130 may penetrate the memory stack MS in the first direction D1, and the memory array 110 may be regarded as a three-dimensional memory structure, but not limited thereto. In some embodiments, other suitable memory architectures may be applied to form the memory array 110 of the present disclosure.

In some embodiments, each of the memory strings 120 may include a NAND string or other suitable vertical memory structures. For example, each of the memory strings 120 may include an epitaxial structure 122, a memory layer 124, a channel layer 126, and a conductive structure 128. The epitaxial structure 122 may include a semiconductor material, such as silicon, but not limited thereto. The memory layer 124 may be a composite layer including a tunneling layer, a storage layer (also known as a "charge trap/storage layer"), and a blocking layer, but not limited thereto. The conductive structure 128 may include polysilicon or other suitable conductive materials. Each of the memory strings 120 may have a cylinder shape (e.g., a pillar shape) penetrating the memory stack MS in the first direction D1, and the channel layer 126, the tunneling layer, the storage layer, and the blocking layer in the memory string 120 may be arranged radially from the center toward the outer surface of the pillar in this order. The tunneling layer in the memory layer 124 may include silicon oxide, silicon oxynitride, or any combination thereof. The storage layer in the memory layer 124 may include silicon nitride, silicon oxynitride, silicon, or any combination thereof. The blocking layer in the memory layer 124 may include silicon oxide, silicon oxynitride, high dielectric constant (high-k) dielectrics, or any combination thereof. For example, the memory layer 124 in the memory string 120 may be an oxide-nitride-oxide (ONO) structure, but not limited thereto. Each of the slit structures 130 may include a conductive material and a dielectric layer disposed between the conductive material and the memory stack MS, and the conductive material in the slit structure 130 may be electrically connected to a doped region 132 disposed in the first substrate 100. In some embodiments, the doped region 132 may be an N-type doped region when the first substrate 100 is a P-type semiconductor substrate, the doped region 132 may be regarded as a common source region, and the slit structure 130 may be regarded as a source contact structure, but not limited thereto. In some embodiments, the slit structure 130 may extend laterally (such as extends in the horizontal direction) for dividing the memory stack MS into several memory blocks, but not limited thereto. In some embodiments, the memory array 110 may further include a cap layer 116 disposed on the memory stack MS, and the each of the memory strings 120 and each of the slit structures 130 may further penetrate the cap layer 116, but not limited thereto. The cap layer 116 may include an oxide layer, such as a silicon oxide layer, or other suitable insulation materials. It is worth noting that the memory array 110 in the present disclosure is not limited to the structure shown in FIG. 1 and/or the structure described above, and other suitable memory array architectures may also be applied in the present disclosure.

In some embodiments, the circuit structure 210 may include one or more of a page buffer, a decoder (e.g., a row decoder and a column decoder), a driver, a charge pump, a current or voltage reference, or any active or passive components required in the circuits (e.g., transistors, diodes, resistors, or capacitors). In some embodiments, the circuit structure 210 may be formed by CMOS technology, but not limited thereto. For example, the circuit structure 210 may include a plurality of transistors (such as first transistors 212 and second transistors 214 shown in FIG. 1), some of the transistors may be disposed on the second substrate 200, and some of the transistors (such as the second transistors 214) may be disposed on a doped region 202 in the second substrate 200. In some embodiments, the doped region 202 may include a doped well, but not limited thereto. An isolation structure 204 (such as a shallow trench isolation) may be disposed in the second substrate 200 for defining active regions corresponding to the transistors. An insulation layer 220 may be disposed on the second substrate 200 and covers the transistors, and contact structures 230 may be disposed in the insulation layer 220 and electrically connected to the transistors respectively. It is worth noting that the circuit structure 210 in the present disclosure is not limited to the structure shown in FIG. 1 and/or the structure described above, and other suitable components required in the circuit structure may also be applied in the present disclosure.

In some embodiments, the non-volatile memory device 301 may further include a first interlayer dielectric 140, a first interconnection structure 150, a second interlayer dielectric 240, and a second interconnection structure 250. The first interlayer dielectric 140 may be disposed on the first front side FS1 of the first substrate 100 and cover the memory array 110, and the second interlayer dielectric 240 may be disposed on the second front side FS2 of the second substrate 200 and cover the circuit structure 210. The first interconnection structure 150 may be at least partially disposed in the first interlayer dielectric 140, and the second interconnection structure 250 may be at least partially disposed in the second interlayer dielectric 240. In some embodiments, the first interlayer dielectric 140 and the second interlayer dielectric 240 may respectively include a plurality of dielectric layers stacked in the first direction D1, and materials of the dielectric layers may include silicon oxide, silicon nitride, silicon oxynitride, low dielectric constant (low-k) dielectric material, any suitable combination thereof, or other suitable dielectric materials. In some embodiments, the first interconnection structure 150 may include conductive layers (such as a conductive layer M11 and a conductive layer M12 shown in FIG. 1) and connection plugs (such as a connection plug V11, a connection plug V13, and a connection plug V14 shown in FIG. 1) alternately disposed in the first direction D1, and the second interconnection structure 250 may also include conductive layers (such as a conductive layer M21, a conductive layer M22, and a conductive layer M23 shown in FIG. 1) and connection plugs (such as a connection plug V21, a connection plug V22, and a connection plug V23 shown in FIG. 1) alternately disposed in the first direction D1, but not limited thereto. The conductive layers and the connection plugs in the first interconnection structure 150 and the second interconnection structure 250 may respectively include a low resistivity material and a barrier layer surrounding the low resistivity material, but not limited thereto.

The low resistivity material mentioned above may include materials having relatively lower resistivity, such as copper, aluminum, and tungsten, and the barrier layer mentioned above may include titanium nitride, tantalum nitride, or other suitable barrier materials, but not limited thereto. The first interconnection structure 150 may be disposed between the memory array 110 and the bonding structure P1, and the bonding structure P1 may be electrically connected with the memory array 110 through the first interconnection structure 150. The second interconnection structure 250 may be disposed between the circuit structure 210 and the bonding structure P1, and the bonding structure P1 may be electrically connected with the circuit structure 210 through the second interconnection structure 250.

In some embodiments, the first substrate 100 with the memory array 110 formed thereon and the second substrate 200 with the circuit structure 210 formed thereon may be combined with each other by a first bonding layer 160 disposed on the first substrate 100 and a second bonding layer 260 disposed on the second substrate 200. The first bonding layer 160 may include a plurality of bonding patterns (such as a first bonding pattern 162 and a third bonding pattern 164 shown in FIG. 1) and a dielectric material disposed between the bonding patterns for electrically isolating the bonding patterns from one another, and the second bonding layer 260 may include a plurality of bonding patterns (such as a second bonding pattern 262 and a fourth bonding pattern 264 shown in FIG. 1) and a dielectric material disposed between the bonding patterns for electrically isolating the bonding patterns from one another. In some embodiments, the dielectric material in the first bonding layer 160 may be regarded as a topmost portion of the first interlayer dielectric 140, and the dielectric material in the second bonding layer 260 may be regarded as a topmost portion of the second interlayer dielectric 240, but not limited thereto. The dielectric materials in the first bonding layer 160 and the second bonding layer 260 may include silicon oxide, silicon nitride, silicon oxynitride, low-k dielectric material, any suitable combination thereof, or other suitable dielectric materials. The bonding patterns in the first bonding layer 160 and the second bonding layer 260 may include conductive materials, such as tungsten, cobalt, copper, aluminum, silicide, any suitable combination thereof, or other suitable conductive materials.

In some embodiments, the first substrate 100 with the memory array 110 formed thereon and the second substrate 200 with the circuit structure 210 formed thereon may be combined with each other by a direct bonding method, such as a metal/dielectric hybrid bonding method, but not limited thereto. In the metal/dielectric hybrid bonding method, the bonding patterns in the first bonding layer 160 may directly contact the bonding patterns in the second bonding layer 260, and the dielectric material in the first bonding layer 160 may directly contact the dielectric material in the second bonding layer 260 without using an additional adhesive layer. However, in some embodiments, the first bonding layer 160 may be bonded to the second bonding layer 260 by an adhesive layer (not shown), or the dielectric material in the first bonding layer 160 and/or the dielectric material in the second bonding layer 260 may be adhesive. In some embodiments, the bonding structure P1 may include a portion of the first bonding layer 160 and/or a portion of the second bonding layer 260, and the shielding structure P2 may include another portion of the first bonding layer 160 and/or another portion of the second bonding layer 260.

For instance, in some embodiments, the bonding structure P1 may include the first bonding pattern 162 in the first bonding layer 160 and the second bonding pattern 262 in the second bonding layer 260, and the shielding structure P2 may include the third bonding pattern 164 in the first bonding layer 160 and the fourth bonding pattern 264 in the second bonding layer 260, but not limited thereto. The first bonding pattern 162 may be electrically connected with the first interconnection structure 150, and the second bonding pattern 262 may be electrically connected with the second interconnection structure 250. The first bonding pattern 162 may directly contact and be electrically connected with the second bonding pattern 262, and the circuit structure 210 may be electrically connected with the memory array 110 through the second interconnection structure 250, the bonding structure P1, and the first interconnection structure 150 accordingly. The third bonding pattern 164 may directly contact and be electrically connected with the fourth bonding pattern 264. In some embodiments, the third bonding pattern 164 may be electrically connected to an internal power source in the circuit structure 210 through the second interconnection structure 250 and/or be electrically connected to an external power source through the first interconnection structure 150 and other connection structures, but not limited thereto. In some embodiments, the first bonding pattern 162 and the third bonding pattern 164 may be at least partially disposed in the first interlayer dielectric 140, and the second bonding pattern 262 and the fourth bonding pattern 264 may be at least partially disposed in the second interlayer dielectric 240, but not limited thereto. When the first substrate 100 and the second substrate 200 are combined with each other by the direct bonding method described above, an interface between the first bonding pattern 162 and the second bonding pattern 262 may be substantially coplanar with an interface between the third bonding pattern 164 and the fourth bonding pattern 264, but not limited thereto. In some embodiments, the shielding structure P2 may further include a portion of the first interconnection structure 150 (such as the connection plug V13) and/or a portion of the second interconnection structure 250 (such as the connection plug V23).

In some embodiment, the first interconnection structure 150 may include a bit line BL electrically connected with at least some of the memory strings 120 described above and a source line mesh SL electrically connected to at least some of the slit structures 130 described above, but not limited thereto. In some embodiments, the bonding structure P1 may be electrically connected with the source line mesh SL, and the circuit structure 210 may transmit common source voltage to the doped regions 132 via the second interconnection structure 250, the bonding structure P1, the source line mesh SL, and the slit structures 130 accordingly. The shielding structure P2 may be used to reduce the coupling effect between the source line mesh SL and the circuit structure 210 when higher voltage is applied to the source line mesh SL and/or when the voltage applied to the source line mesh SL changes. However, the present disclosure is not limited to the condition described above. In some embodiments, the circuit structure 210 may be electrically connected to other portion of the memory array 110 through the bonding structure P1, and the shielding structure P2 may surround the bonding structure P1 for reducing the coupling effects.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 3:
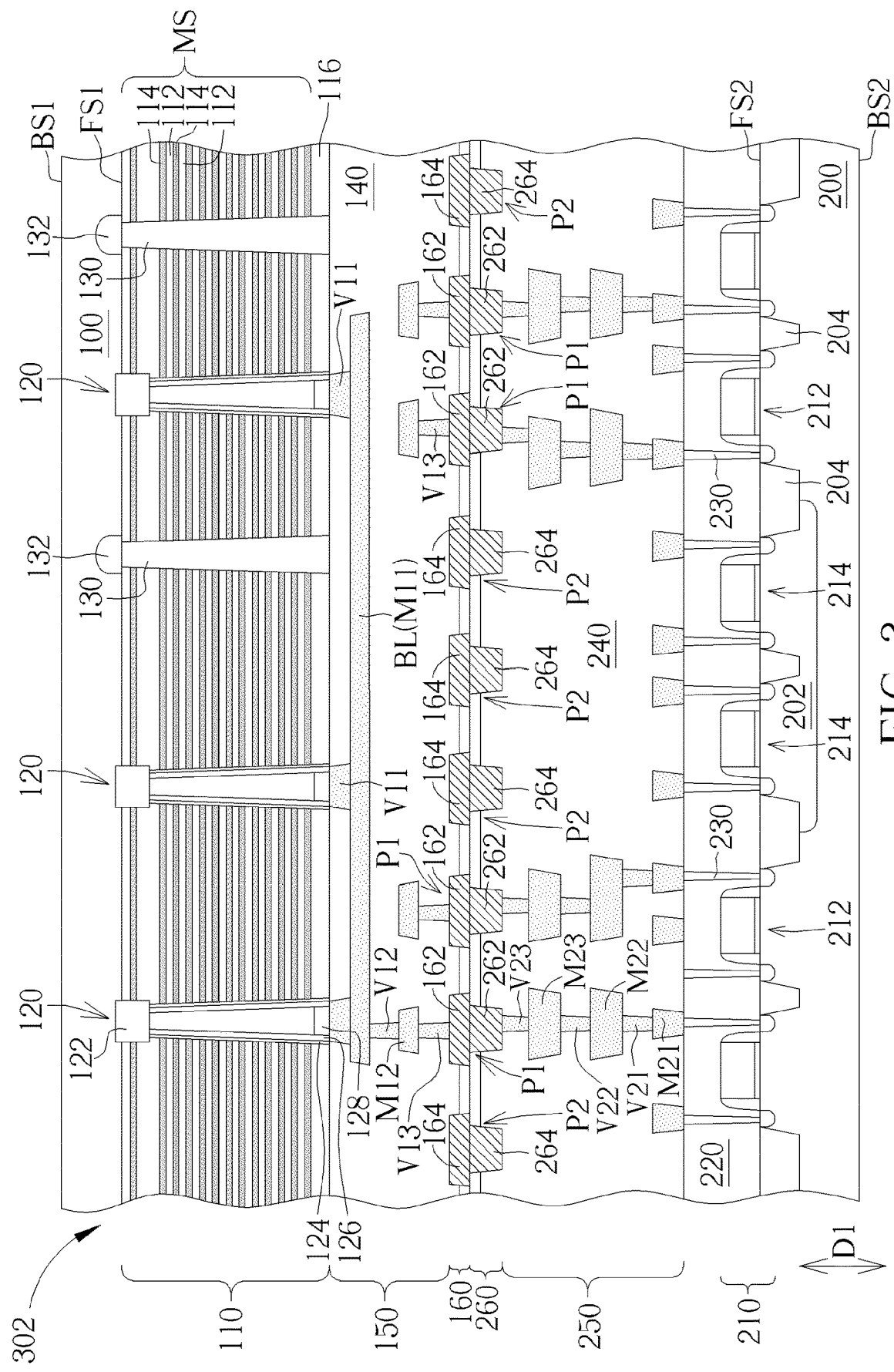
FIG. 3 is a schematic drawing illustrating a non-volatile memory device according to a second embodiment of the present disclosure.

Please refer to FIG. 3. FIG. 3 is a schematic drawing illustrating a non-volatile memory device 302 according to a second embodiment of the present disclosure. As shown in FIG. 3, in the memory device 302, the bonding structure P1 may be electrically connected with the bit line BL, and the circuit structure 210 may be electrically connected to the memory strings 120 via the second interconnection structure 250, the bonding structure P1, and the first interconnection structure 150 (such as the connection plug V13, the conductive layer M12, a connection plug V12, the bit line BL, and the connection plug V11 shown in FIG. 3) accordingly. In some embodiments, the non-volatile memory device may include a plurality of the bonding structures P1 electrically connected with different portions of the memory array 110 respectively and separated from one another, the shielding structure P2 may surround each of the bonding structures P1 in the horizontal direction. For instance, some of the bonding structures P1 may be electrically connected with word lines (not shown), and the circuit structure 210 may be electrically connected to the conductive layers in the memory stack MS via the bonding structure P1 and the word lines.

Figure 4:
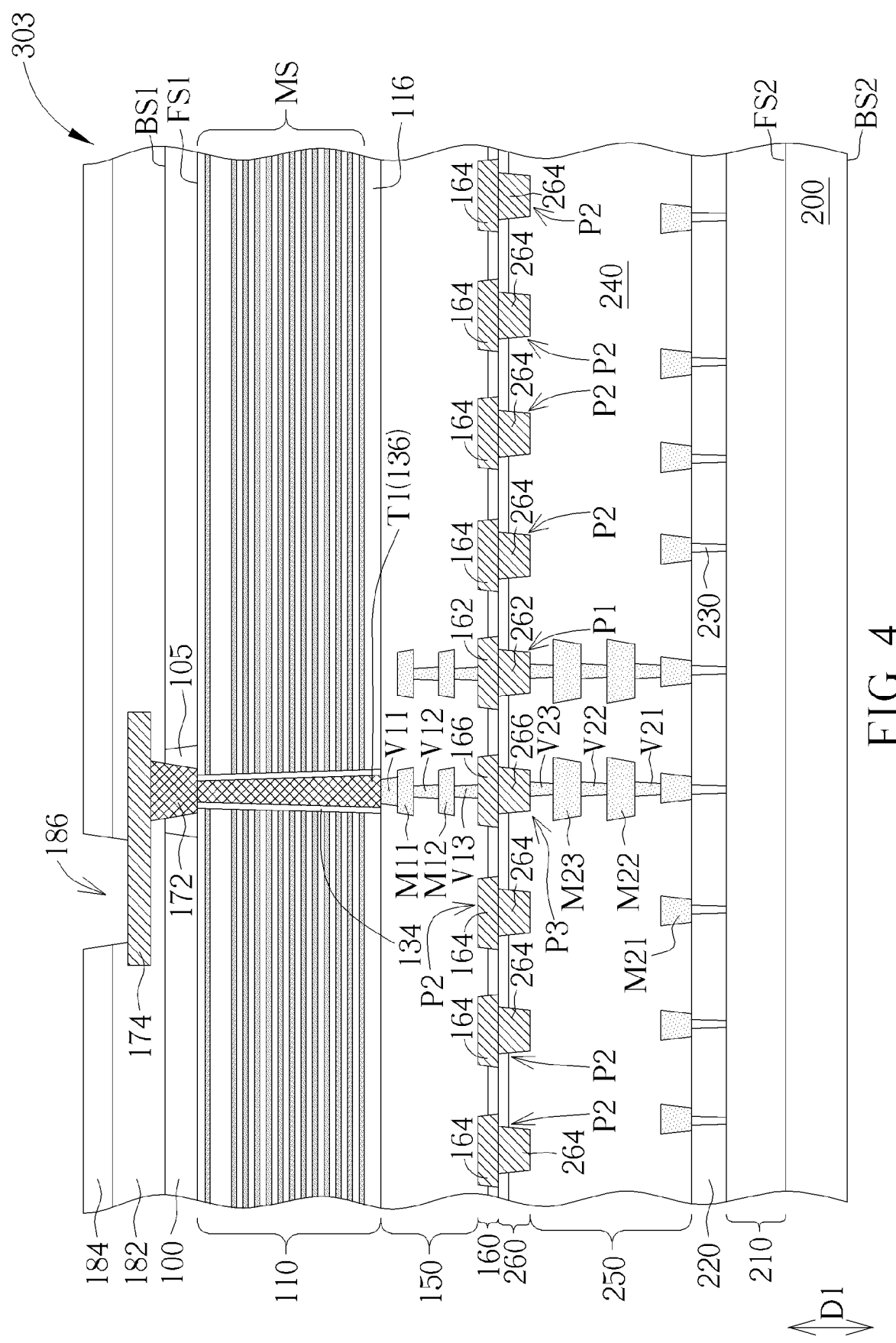
FIG. 4 is a schematic drawing illustrating a non-volatile memory device according to a third embodiment of the present disclosure.

Please refer to FIG. 4. FIG. 4 is a schematic drawing illustrating a non-volatile memory device 303 according to a third embodiment of the present disclosure. As shown in FIG. 4, the non-volatile memory device 303 may include a connection structure P3 disposed between the memory array 110 and the circuit structure 210. The connection structure P3 may be electrically connected with the circuit structure 210, and the shielding structure P2 may surround the connection structure P3 and the bonding structure P1 in the horizontal direction. In some embodiments, the connection structure P3 may include a fifth bonding pattern 166 in the first bonding layer 160 and a sixth bonding pattern 266 in the second bonding layer 260, but not limited thereto. The fifth bonding pattern 266 may be electrically connected with the first interconnection structure 150, and the sixth bonding pattern 266 may be electrically connected with the second interconnection structure 250. The fifth bonding pattern 166 may directly contact and be electrically connected with the sixth bonding pattern 266. In some embodiments, the non-volatile memory device 303 may further include a contact pad (such as a first contact pad 174 shown in FIG. 4), a contact structure (such as a first contact structure T1 shown in FIG. 4), an insulation region 105, insulation layers (such as an insulation layer 182 and an insulation layer 184 shown in FIG. 4), a through substrate contact structure 172, and an opening 186. The insulation layer 182, the insulation layer 184, and the first contact pad 174 may be disposed at the first back side BS1 of the first substrate 100, and the first contact pad 174 may be disposed in the insulation layer 182, but not limited thereto. The insulation region 105 may be disposed in the first substrate 100, and the through substrate contact structure 172 may penetrate the insulation region 105 and the insulation layer 182 between the first contact pad 174 and the first substrate 100 for being connected with the first contact pad 174. The first contact structure T1 may penetrate the memory array 110 and be electrically connected with the first contact pad by the through substrate contact structure 172. The opening 186 may penetrate the insulation layer 184 and the insulation layer 182 above the first contact pad 174 for exposing a part of the first contact pad 174. Therefore, the circuit structure 210 may be electrically connected with the first contact pad 174 through the second interconnection structure 250, the connection structure P3, the first interconnection structure 150, the first contact structure T1, and the through substrate contact structure 172, but not limited thereto. In some embodiment, the first contact structure T1 may include a conductive material 136, and an insulation layer 134 may be disposed between the conductive material 136 and the memory stack MS for insulating the first contact structure T1 from the memory stack MS, but not limited thereto. The insulation layer 134, the insulation layer 182, the insulation layer 184, and the insulation region 105 may include silicon oxide, silicon nitride, silicon oxynitride, or other suitable insulation materials. In some embodiments, the material composition of the insulation layer 184 may be different from the material composition of the insulation layer 182, and the insulation layer 184 be regarded as a hard mask layer in a process of forming the opening 186, but not limited thereto. The conductive material 136, the through substrate contact structure 172, and the first contact pad 174 may include conductive materials, such as tungsten, cobalt, copper, aluminum, any combination thereof, or other suitable conductive materials. It is worth noting that the first contact structure T1 and the first contact pad 174 disposed at the first back side BS1 of the first substrate 100 may also be applied to other embodiments of the present disclosure.

Figure 5:
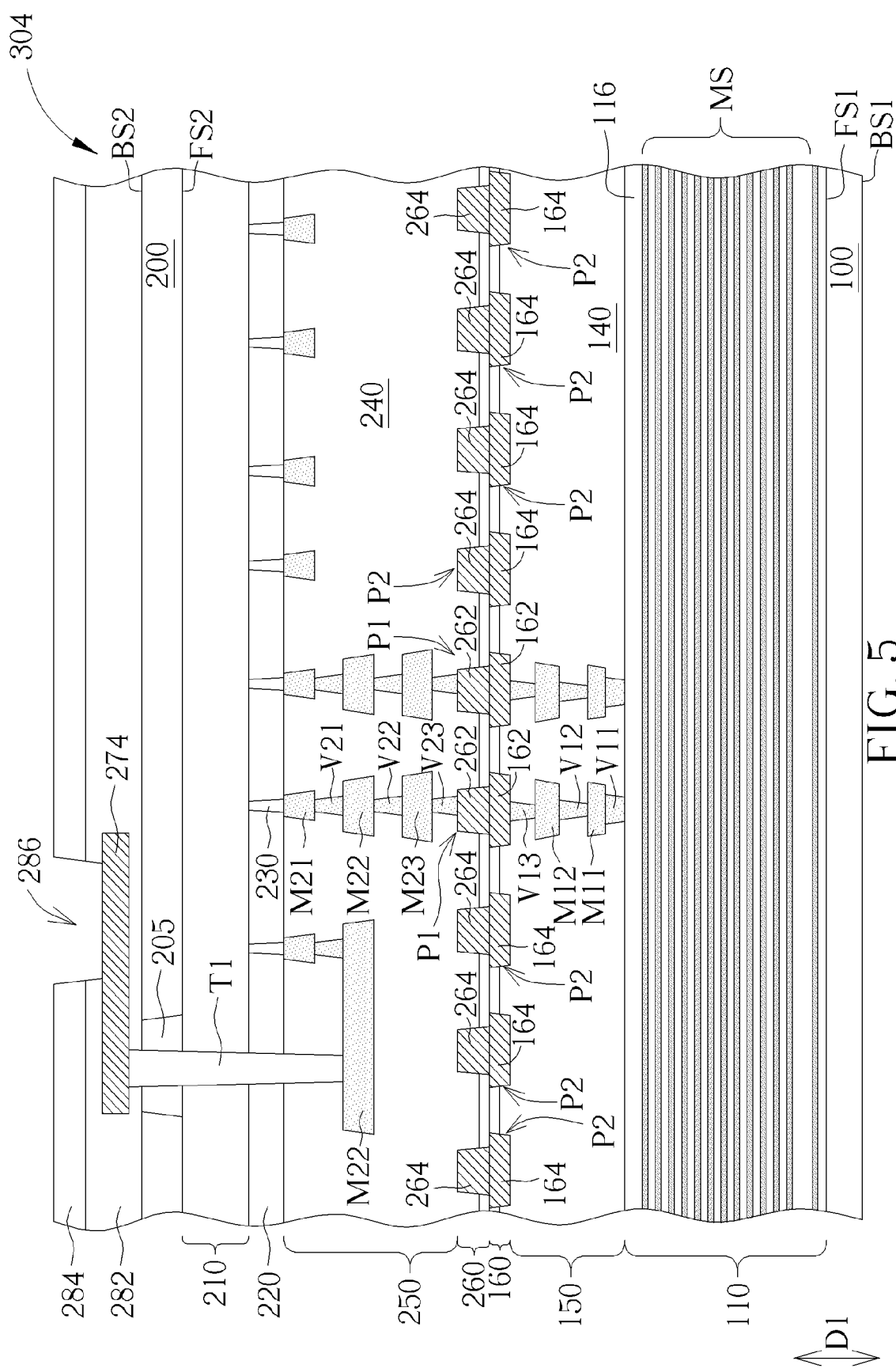
FIG. 5 is a schematic drawing illustrating a non-volatile memory device according to a fourth embodiment of the present disclosure.

Please refer to FIG. 5. FIG. 5 is a schematic drawing illustrating a non-volatile memory device 304 according to a fourth embodiment of the present disclosure. As shown in FIG. 5, the non-volatile memory device 304 may further include the first contact structure T1, an insulation region 205, a second contact pad 274, an insulation layer 282, an insulation layer 284, and an opening 286. The insulation layer 282, the insulation layer 284, and the second contact pad 274 may be disposed at the second back side BS2 of the second substrate 200, and the second contact pad 274 may be disposed in the insulation layer 282, but not limited thereto. The insulation region 205 may be disposed in the second substrate 200, and the opening 286 may penetrate the insulation layer 284 and the insulation layer 282 above the second contact pad 274 for exposing a part of the second contact pad 274. The first contact structure T1 in this embodiment may penetrate a part of the second interlayer dielectric 240, the insulation layer 220, the insulation region 205, and a part of the insulation layer 282 disposed between the second contact pad 274 and the second substrate 200 for being electrically connected with the second contact pad 274 and a portion of the second interconnection structure 250 (such as the conductive layer M22). Therefore, the circuit structure 210 may be electrically connected with the second contact pad 274 through the second interconnection structure 250 and the first contact structure T1, but not limited thereto. In some embodiment, the insulation layer 282, the insulation layer 284, and the insulation region 205 may include silicon oxide, silicon nitride, silicon oxynitride, or other suitable insulation materials. In some embodiments, the material composition of the insulation layer 284 may be different from the material composition of the insulation layer 282, and the insulation layer 284 be regarded as a hard mask layer in a process of forming the opening 286, but not limited thereto. The second contact pad 274 may include conductive materials, such as tungsten, cobalt, copper, aluminum, any combination thereof, or other suitable conductive materials. It is worth noting that the first contact structure T1 and the second contact pad 274 disposed at the second back side BS2 of the second substrate 200 may also be applied to other embodiments of the present disclosure.

Figure 6:
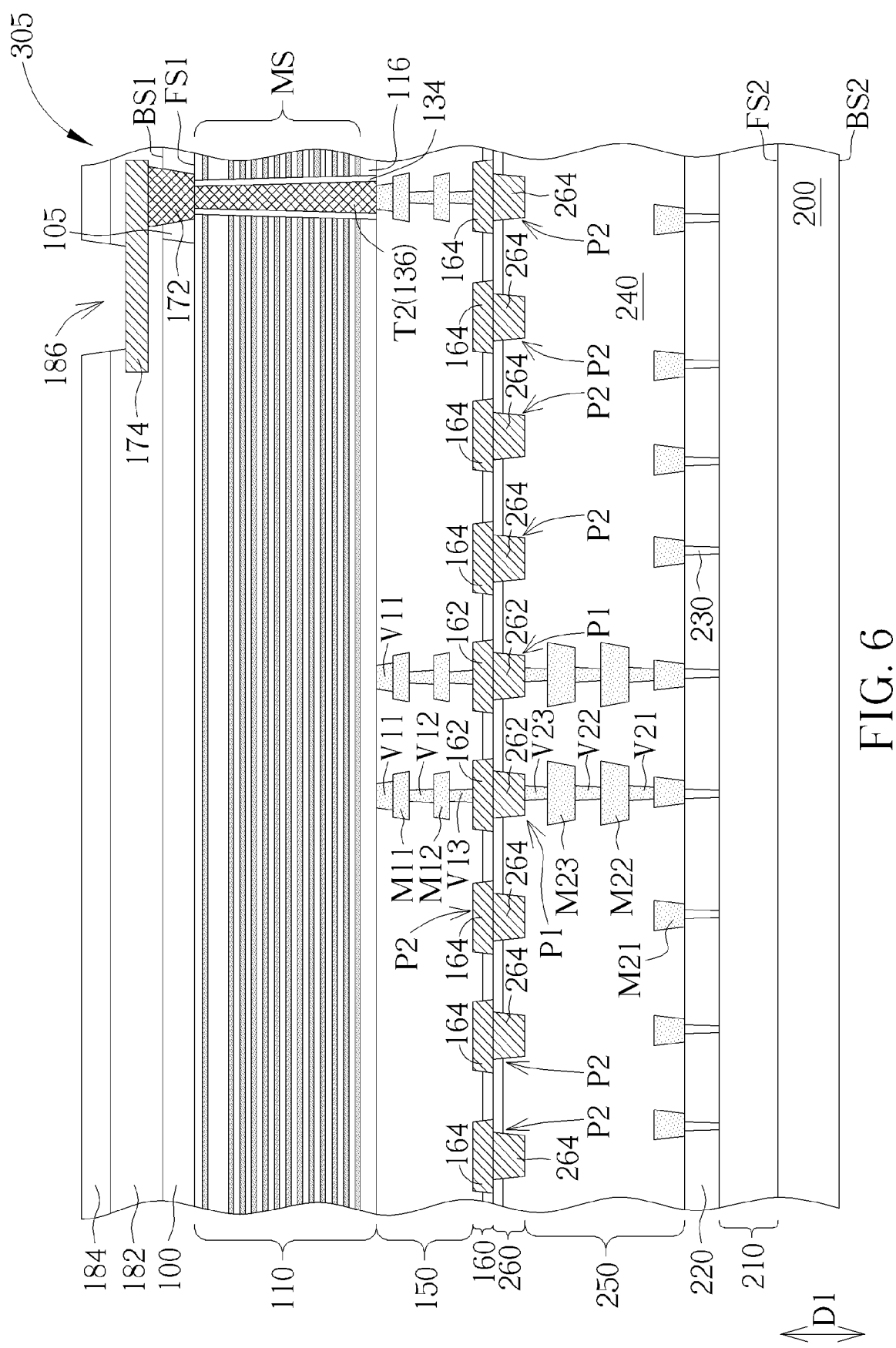
FIG. 6 is a schematic drawing illustrating a non-volatile memory device according to a fifth embodiment of the present disclosure.

Please refer to FIG. 6 and FIG. 4. FIG. 6 is a schematic drawing illustrating a non-volatile memory device 305 according to a fifth embodiment of the present disclosure. In some embodiments, FIG. 6 and FIG. 4 may be regarded as schematic drawings illustrating different portions of the same non-volatile memory device, but not limited thereto. As shown in FIG. 6, the non-volatile memory device 305 may further include a second first contact structure T2 penetrating the memory stack MS, and the shielding structure P2 may be electrically connected with the first contact pad 174 through the first interconnection structure 150, the second first contact structure T2, and the through substrate contact structure 172, but not limited thereto. In other words, the shielding structure P2 may be electrically connected with an external power source through the first contact pad 174 disposed at the first back side BS1 of the first substrate 100.

Figure 7:
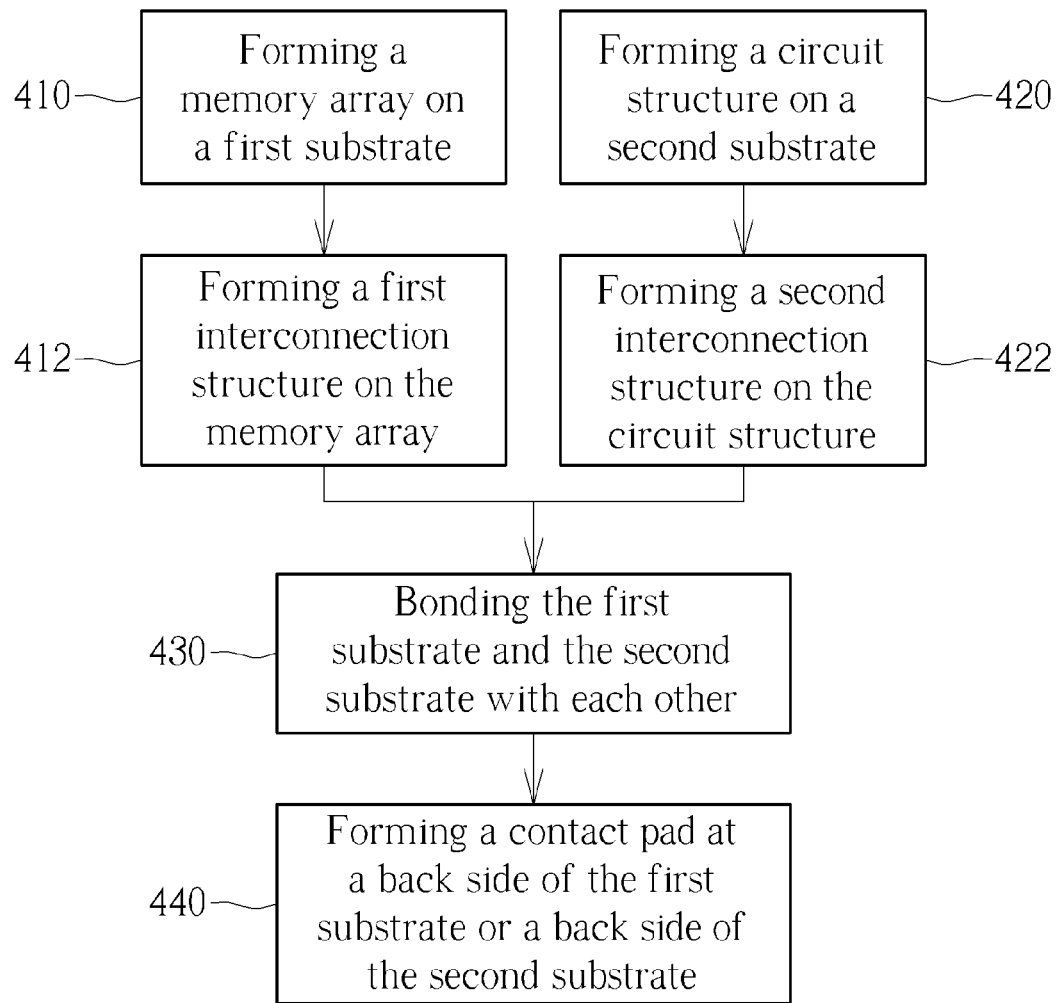
FIG. 7 is a flowchart of a manufacturing method of a non-volatile memory device according to an embodiment of the present disclosure.
Figure 8:
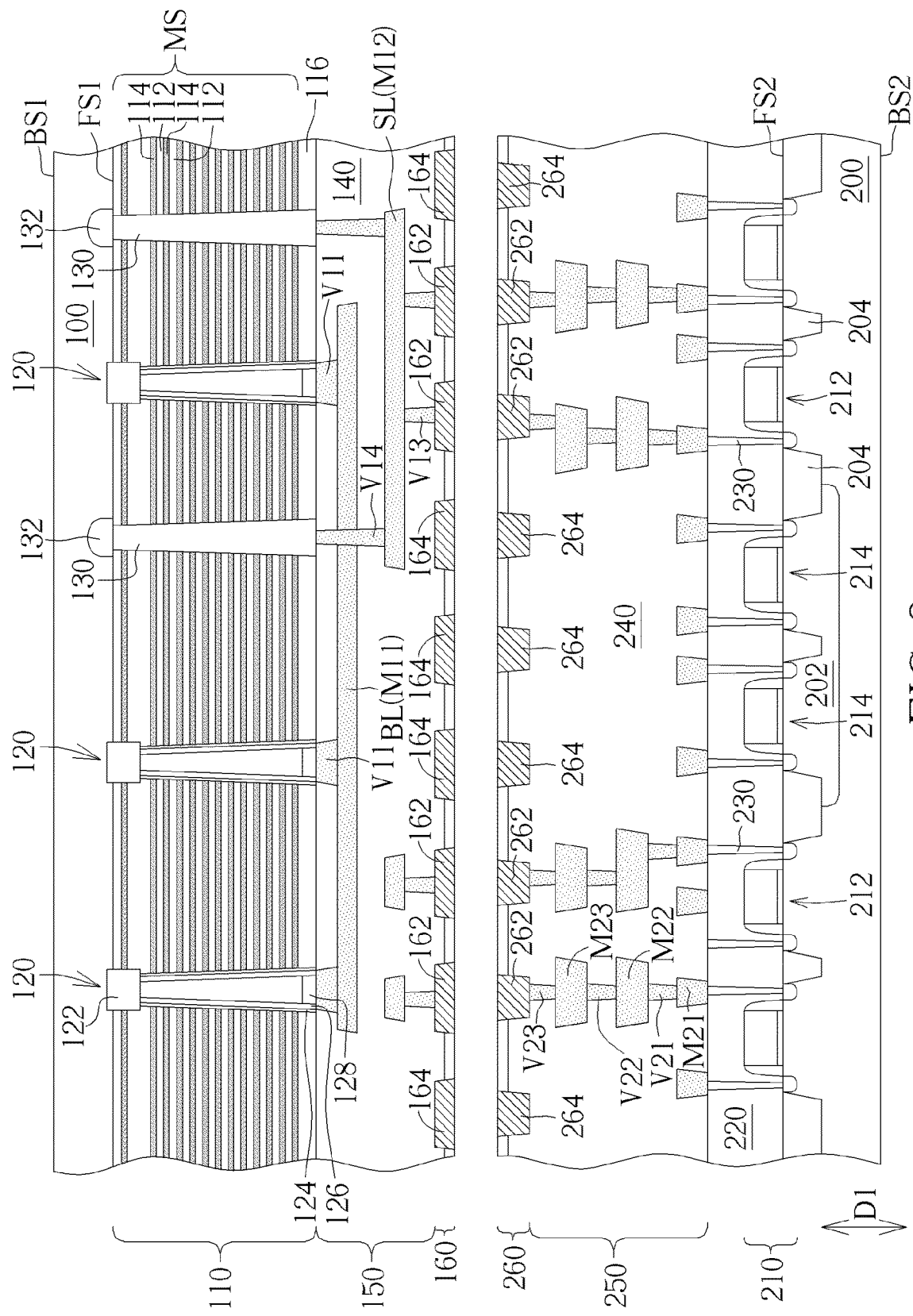
FIG. 8 is a schematic drawing illustrating a bonding process in the manufacturing method of the non-volatile memory device according to an embodiment of the present disclosure.

Please refer to FIG. 7, FIG. 8, FIG. 1, and FIG. 2. FIG. 7 is a flowchart of a manufacturing method of a non-volatile memory device according to an embodiment of the present disclosure. FIG. 8 is a schematic drawing illustrating a bonding process in the manufacturing method of the non-volatile memory device in this embodiment, and FIG. 1 may be regarded as a schematic drawing in a step subsequent to FIG. 8. As shown in FIG. 7, FIG. 8, FIG. 1, and FIG. 2, the manufacturing method of the non-volatile memory device in this embodiment may include but is not limited to the following steps. In step 410, the memory array 110 may be formed on the first substrate 100, and the memory array 110 may be formed at the first front side FS1 of the first substrate 100. In step 420, the circuit structure 210 may be formed on the second substrate 200, and the circuit structure 210 may be formed at the second front side FS2 of the second substrate 200. In step 430, a bonding process is performed for bonding the first substrate 100 with the memory array 110 formed thereon and the second substrate 200 with the circuit structure 210 formed thereon. The second front side FS2 of the second substrate 200 may face the first front side FS1 of the first substrate 100 during and after the bonding process. The bonding structure P1 may be located between the memory array 110 and the circuit structure 210 in the first direction D1, the circuit structure 210 may be electrically connected with the memory array 110 through the bonding structure P1, and the shielding structure P2 may be located between the memory array 110 and the circuit structure 210 and surround the bonding structure P1. The shielding structure may be electrically connected to the voltage source VS. In some embodiments, other required components may be formed on the first substrate 100 and the second substrate 200 before the bonding process. For example, step 412 and step 422 may be carried out before the step 430, but not limited thereto. In the step 412, the first interconnection structure 150 may be formed on the memory array 110 before the bonding process, and the bonding structure P1 may be electrically connected with the memory array 110 through the first interconnection structure 150. In the step 422, the second interconnection structure 250 may be formed on the circuit structure 210 before the bonding process, and the bonding structure P1 may be electrically connected with the circuit structure 210 through the second interconnection structure 250.

As shown in FIG. 7, FIG. 8, and FIG. 1, a forming method of the bonding structure P1 may include but is not limited to the following steps. A first portion of the bonding structure P1 (such as the first bonding pattern 162) may be formed on the first substrate 100 before the bonding process, and the first portion of the bonding structure P1 may be electrically connected to the memory array 110 through the first interconnection structure 150. A second portion of the bonding structure P1 (such as the second bonding pattern 262) may be formed on the second substrate 200 before the bonding process, and the second portion of the bonding structure P1 may be electrically connected to the circuit structure 210 through the second interconnection structure 250. When the bonding process is a direct bonding process, such as a metal/dielectric hybrid bonding process, the first portion of the bonding structure P1 (such as the first bonding pattern 162) may contact and be electrically connected with the second portion of the bonding structure P1 (such as the second bonding pattern 162) after the bonding process.

As shown in FIG. 7, FIG. 8, and FIG. 1, a forming method of the shielding structure P2 may include but is not limited to the following steps. A first portion of the shielding structure P2 (such as the third bonding pattern 164) may be formed on the first substrate 100 before the bonding process. A second portion of the shielding structure P2 (such as the fourth bonding pattern 264) may be formed on the second substrate 200 before the bonding process. When the bonding process is a direct bonding process, such as a metal/dielectric hybrid bonding process, the first portion of the shielding structure P2 (such as the third bonding pattern 164) may contact and be electrically connected with the second portion of the shielding structure P2 (such as the fourth bonding pattern 264) after the bonding process. In other words, the first interlayer dielectric 140, the first interconnection structure 150, the first bonding layer 160, the second interlayer dielectric 240, the second interconnection structure 250, and the second bonding lay 260 may be formed before the bonding process described above.

Please refer to FIG. 7 and FIG. 4. As shown in FIG. 7 and FIG. 4, in some embodiment, step 440 may be carried out after the bonding process. In the step 440, the contact pad (such as the first contact pad 174) may be formed at the first back side BS1 of the first substrate 100 after the bonding process. In some embodiment, a thinning process may be performed to the first substrate 100 from the first back side BS1 of the first substrate 100 before the step of forming the insulation layer 182 for reducing the thickness of the first substrate 100, but not limited thereto. In some embodiments, the insulation region 105 and the first contact structure T1 may be formed before the bonding process, and the through substrate contact structure 172, the first contact pad 174, the insulation layer 182, the insulation layer 184, and the opening 186 may be formed after the bonding process, but not limited thereto. In addition, the connection structure P3 may be formed between the memory array 110 and the circuit structure 210. The connection structure P3 may be electrically connected with the circuit structure 210, and the shielding structure P2 may surround the connection structure P3 and the bonding structure P1 in the horizontal direction. The first contact structure T1 may be formed penetrating the memory array 110. The first contact pad 174 may be formed at the first back side BS1 of the first substrate 100. The circuit structure 210 may be electrically connected with the first contact pad 174 through second interconnection structure 250, the connection structure P3, the first contact structure T1, and the through substrate contact structure 172, but not limited thereto.

Please refer to FIG. 7 and FIG. 5. As shown in FIG. 7 and FIG. 5, in some embodiment, step 440 may be carried out after the bonding process. In the step 440, the contact pad (such as the second contact pad 274) may be formed at the second back side BS2 of the second substrate 200 after the bonding process. In some embodiment, a thinning process may be performed to the second substrate 200 from the second back side BS2 of the second substrate 200 before the step of forming the insulation layer 282 for reducing the thickness of the second substrate 100, but not limited thereto. In some embodiments, the insulation region 205 may be formed before the bonding process, and the first contact structure T1, the second contact pad 274, the insulation layer 282, the insulation layer 284, and the opening 286 may be formed after the bonding process, but not limited thereto.

To summarize the above descriptions, in the non-volatile memory device and the manufacturing method thereof according to the present disclosure, the memory array disposed on the first substrate may be electrically connected with the circuit structure disposed on the second substrate through the bonding structure. The shielding structure may be disposed between the memory array and the circuit structure and surround the bonding structure. The shielding structure may be electrically connected to the voltage source for reducing coupling effects between the bonding structure and the circuit structure, coupling effects between the circuit structure and the memory array, and/or other coupling effects inside the non-volatile memory device. The operation and/or the electrical performance of the non-volatile memory device may be improved accordingly. In addition, by disposing the shielding structure in the present disclosure, the thickness of the interlayer dielectric may be relatively reduced, and that will be beneficial for the manufacturing processes of the non-volatile memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first semiconductor structure;
    a second semiconductor structure;
    a bonding structure between the first semiconductor structure and the second semiconductor structure, the bonding structure comprising a first bonding pattern and a second bonding pattern in contact with each other, the first semiconductor structure being electrically connected with the second semiconductor structure through the bonding structure; and
    a shielding structure between the first semiconductor structure and the second semiconductor structure and surrounding the bonding structure, the shielding structure comprising a third bonding pattern and a fourth bonding pattern in contact with each other, the shielding structure being electrically connected with a biased voltage through a first contact pad.

2. The semiconductor device of claim 1, wherein the shielding structure comprises a plurality of segments isolated from each other and each extending in a horizontal direction.

3. The semiconductor device of claim 2, wherein a first height of the shielding structure in a vertical direction perpendicular to a bonding interface between the first semiconductor structure and the second semiconductor structure is no less than a second height of the bonding structure in the vertical direction.

4. The semiconductor device of claim 2, wherein the plurality of segments are disposed around the bonding structure.

5. The semiconductor device of claim 2, wherein:
    at least a segment of the shielding structure is configured to be biased to ground; or
    at least a segment of the shielding structure is configured to be biased to a non-zero voltage.

6. The semiconductor device of claim 2, wherein the shielding structure comprises:
    a first segment configured to be electrically interconnected with a first voltage; and
    a second segment configured to be electrically interconnected with a second voltage different from the first voltage.

7. The semiconductor device of claim 1, wherein:
    the first bonding pattern is in contact with the second bonding pattern at a first interface between the first bonding pattern and the second bonding pattern; and
    the third bonding pattern is in contact with the fourth bonding pattern at a second interface between the third bonding pattern and the fourth bonding pattern.

8. The semiconductor device of claim 7, wherein the first interface and the second interface are coplanar.

9. The semiconductor device of claim 1, wherein the shielding structure is electrically isolated from the bonding structure.

10. The semiconductor device of claim 1, wherein:
    the first semiconductor structure comprises:
        a memory array, and
        a first interconnection structure between the memory array and the bonding structure,
        wherein the bonding structure is electrically connected with the memory array through the first interconnection structure; and
    the second semiconductor structure comprises:
        a periphery circuit configured to control the memory array, and
        a second interconnection structure between the periphery circuit and the bonding structure,
        wherein the bonding structure is electrically connected with the periphery circuit through the second interconnection structure.

11. The semiconductor device of claim 10, wherein:
    the first bonding pattern is electrically connected with the first interconnection structure; and
    the second bonding pattern is electrically connected with the second interconnection structure.

12. The semiconductor device of claim 10, further comprising:
    a second contact pad; and
    a contact structure electrically connected with the second contact pad,
    wherein the periphery circuit is electrically connected with the second contact pad through the contact structure.

13. The semiconductor device of claim 12, wherein:
    the contact structure is in the first semiconductor structure and in electrically connected with the first interconnection structure, or
    the contact structure is in the second semiconductor structure and in electrically connected with the second interconnection structure.

14. A method for forming a semiconductor device, comprising:
    forming a first bonding pattern and a third bonding pattern on a first semiconductor structure, where in the third bonding pattern surrounding the first bonding pattern;
    forming a second bonding pattern and a fourth bonding pattern on a second semiconductor structure, where in the fourth bonding pattern surrounding the second bonding pattern;

bonding the first semiconductor structure and the second semiconductor structure, such that the first bonding pattern is attached to the second bonding pattern to form a bonding structure, and the third bonding pattern is attached to the fourth bonding pattern to form a shielding structure, wherein the shielding structure surrounds the bonding structure and is electrically isolated from the bonding structure; and forming a first contact pad electrically connected to the shielding structure for supplying a voltage source to the shielding structure.

15. The method of claim 14, wherein:

forming the third bonding pattern comprises forming a plurality of segments of third bonding pattern each extending in a horizontal direction; and forming the fourth bonding pattern comprises forming a plurality of segments of fourth bonding pattern each extending in the horizontal direction.

16. The method of claim 14, further comprising forming the first semiconductor structure, comprising:

forming a memory array; and forming a first interconnection structure between the memory array and the first bonding pattern, wherein the first bonding pattern is electrically connected with the memory array through the first interconnection structure.

17. The method of claim 16, further comprising forming the second semiconductor structure, comprising:

forming a periphery circuit; and forming a second interconnection structure between the periphery circuit and the second bonding pattern, wherein the second bonding pattern is electrically connected with the periphery circuit through the second interconnection structure.

18. The method of claim 17, further comprising:

forming a second contact pad; and forming a contact structure electrically connected with the second contact pad, wherein the periphery circuit is electrically connected with the second contact pad through the contact structure.

19. The method of claim 18, wherein forming the contact structure comprises:

forming the contact structure in the first semiconductor structure and in electrically connected with the first interconnection structure; or forming the contact structure in the second semiconductor structure and in electrically connected with the second interconnection structure.

20. The method of claim 15, wherein forming the shielding structure comprising:

forming a plurality of segments of the shielding structure that are isolated from each other and disposed around the bonding structure.

* * * * *